(12) United States Patent
Yao et al.

(10) Patent No.: US 6,617,657 B1
(45) Date of Patent: Sep. 9, 2003

(54) PROCESS FOR MANUFACTURE OF MICRO ELECTROMECHANICAL DEVICES HAVING HIGH ELECTRICAL ISOLATION

(75) Inventors: Jun J. Yao, Thousand Oaks, CA (US); Robert J. Anderson, Thousand Oaks, CA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/710,326

(22) Filed: Nov. 9, 2000

Related U.S. Application Data

(62) Division of application No. 09/075,008, filed on May 8, 1998, now Pat. No. 6,159,385.

(51) Int. Cl.[7] .............................. H01L 29/82; H01P 1/10
(52) U.S. Cl. .................. 257/415; 257/522; 333/262; 438/52; 438/53
(58) Field of Search ................................ 257/414, 415, 257/417, 419, 522; 438/50, 52, 53; 216/2, 33, 36, 80; 333/262

(56) References Cited

U.S. PATENT DOCUMENTS

| | | | |
|---|---|---|---|
| 5,578,976 A | * 11/1996 | Yao | 333/262 |
| 5,761,350 A | 6/1998 | Koh | |
| 5,783,340 A | 7/1998 | Farino et al. | |
| 5,804,314 A | 9/1998 | Field et al. | |
| 5,903,380 A | 5/1999 | Motamedi et al. | |
| 5,959,516 A | 9/1999 | Chang et al. | |

(List continued on next page.)

FOREIGN PATENT DOCUMENTS

| | | |
|---|---|---|
| EP | 0 665 590 A2 | 8/1995 |
| EP | 0 711 029 A2 | 5/1996 |
| EP | 0 763 844 | 3/1997 |

OTHER PUBLICATIONS

Toumazou, C. et al., n–step Charge Injection Cancellation Scheme for Very Accurate Switched Current Circuits, Electronic Letters, V.30 (9) 680–681: 1994.

(List continued on next page.)

*Primary Examiner*—Minh Loan Tran
(74) *Attorney, Agent, or Firm*—Quarles & Brady; Alexander M. Gerasimow; William R. Walbrun

(57) ABSTRACT

The present invention relates to a fabrication process relating to a fabrication process for manufacture of microelectromechanical (MEM) devices such as cantilever supported beams. This fabrication process requires only two lithographic masking steps and offers moveable electromechanical devices with high electrical isolation. A preferred embodiment of the process uses electrically insulating glass substrate as the carrier substrate and single crystal silicon as the MEM component material. The process further includes deposition of an optional layer of insulating material such as silicon dioxide on top of a layer of doped silicon grown on a silicon substrate. The silicon dioxide is epoxy bonded to the glass substrate to create a silicon-silicon dioxide-epoxy-glass structure. The silicon is patterned using anisotropic plasma dry etching techniques. A second patterning then follows to pattern the silicon dioxide layer and an oxygen plasma etch is performed to undercut the epoxy film and to release the silicon MEM component. This two-mask process provides single crystal silicon MEMs with electrically isolated MEM component. Retaining silicon dioxide insulating material in selected areas mechanically supports the MEM component.

17 Claims, 4 Drawing Sheets

U.S. PATENT DOCUMENTS

| | | | |
|---|---|---|---|
| 5,995,688 A | | 11/1999 | Aksyuk et al. |
| 6,046,066 A | | 4/2000 | Fang et al. |
| 6,060,336 A | * | 5/2000 | Wan .............................. 438/50 |
| 6,071,426 A | | 6/2000 | Lee et al. |
| 6,094,102 A | | 7/2000 | Chang et al. |
| 6,100,477 A | | 8/2000 | Randall et al. |
| 6,114,794 A | | 9/2000 | Dhuler et al. |
| 6,137,206 A | | 10/2000 | Hill |
| 6,159,385 A | | 12/2000 | Yao et al. |
| 6,188,322 B1 | | 2/2001 | Yao et al. |
| 6,232,841 B1 | | 5/2001 | Bartlett et al. |
| 6,232,847 B1 | | 5/2001 | Marcy, 5th et al. |
| 6,348,788 B1 | | 2/2002 | Yao et al. |

OTHER PUBLICATIONS

Emmerich, H., et al., A Novel Micromachined Magnetic–Field Sensor, MEMS 99 IEEE Conference, Jan. 17–21, 1999, IEEE Catalog No. 99ch36291c.

Madou, Marc, Fundamentals of Microfabrication, Chapters 2–4, CRC Press LLC, Boca Raton, FL: 1997.

Kovacs, Gregory T.A., Micromachined Transducers Sourcebook, Table of Contents, pp. 77–119 and Index, WCB McGraw–Hill, U.S.A.: 1998.

Teegarden, Darrell et al., How to Model and Simulate Microgyroscope Systems, IEEE Spectrum, 66–75, Jul. 1998.

Emmerich, Harald et al., Magnetic Field Measurements with a Novel Surface Micromachined Magnetic–Field Sensor, IEEE Transactions on Electron Devices, V. 47 (5) 972–977, May 2000.

McGruer, N.E. et al., Electrostatically Actuated Micro-switches; Scaling Properties, Solid–State Sensor and Actuator Workshop, Hilton Head Island, South Carolina, Jun. 8–11, 1998, pp. 132–135.

Miyajima, Hiroshi et al., High–Aspect–Ratio Photolithography for MEMS Applications, J. of Microelectromechanical Sys., V.4(4) 220–229, Dec. 1995.

Lu, Crist et al., A Monolithic Surface Micromachined Accelerometer with Digital Output, IEEE J. of Solid State Circuits, V. 30 (12) 1367–1373, Dec. 1995.

Chen, Ming–Jer et al., Weak Inversion Charge Injection in Analog MOS Switches, IEEE J. of Solid–State Circuits, V. 30 (5) 604–606, May 1995.

Lemkin, Mark A. et al., A Fully Differential Lateral S? Accelerometer with Drift Cancellation Circuitry, Solid–State Sensor and Actuator Workshop, Hilton Head, South Carolina, Jun. 2–6, 1996, pp. 90–93.

Boser, Bernhard E. et al., Surface Micromachined Accelerometers, IEEE J. of Solid–State Circuits, V. 31 (3) 366–375, Mar. 1996.

Fedder, Gary K. et al., Multimode Digital Control of a Suspended Polysilicon Microstructure, J. of Microelectromechanical Sys., V. 5 (4) 283–297, Dec. 1996.

Noriega, Gerardo, Sigma–Delta A/D Converters–Audio and Medium Bandwidths, Technical Notes–DT3 from RMS Instruments website: www.rmsinst.com, 6 pages, Feb. 1996.

Internal page: Decimator Filter DLL, NeuroDimension Inc.: www.nd.com, May 31, 2001.

U.S. patent application Ser. No.: 09/406,654, filed on Sep. 27, 1999.

U.S. patent application Ser. No.: 09/400,125, filed on Sep. 21, 1999.

U.S. patent application Ser. No.: 09/406,509, filed on Sep. 28, 1999.

U.S. patent application Ser. No.: 09/955,493, filed on Sep. 18, 2001.

U.S. patent application Ser. No.: 09/955,494, filed on Sep. 18, 2001.

U.S. patent application Ser. No.: 09/675,861, filed on Sep. 29, 2000.

* cited by examiner

PROCESS FOR MANUFACTURE OF MICRO ELECTROMECHANICAL DEVICES HAVING HIGH ELECTRICAL ISOLATION

This is a division of application Ser. No. 09/075,008, filed May 8, 1998, now U.S. Pat. No. 6,159,385.

BACKGROUND OF THE INVENTION

1. Field of the Invention

The present invention relates to micro electromechanical (MEM) systems and, more particularly, to fabrication of MEM components with a high electrically isolated substrate.

2. Description of Related Art

Micro electromechanical (MEM) components are being progressively introduced into many electronic circuit applications and a variety of micro-sensor applications. Examples of MEM components are radio frequency (RF) switches, high Q capacitors, pressure transducers and accelerometers. One such MEM component, a MEM switch, is disclosed in U.S. Pat. No. 5,578,976 which issued to Rockwell International Corporation the assignee of the present application. This MEM switch is fabricated on a GaAs substrate with a cantilevered switch arm formed from silicon dioxide deposited upon a sacrificial layer. Contacts and electrodes are readily formed through deposition of gold and aluminum, respectively.

Another prior art method for creating cantilever beams required a deep anisotrophic etch into a silicon substrate and application of either a silicon nitride or oxide layer to coat the top and side walls of the exposed cut. An isotrophic etch of the silicon substrate undercuts and frees the MEM component. Unfortunately, this method is not readily adaptable for applications where non-conductive, high resistance substrates such as glass are desired for high isolation applications.

Another method, often referred to as a surface micro machining, uses a sacrificial layer such as silicon dioxide deposited on a silicon substrate. MEM component material, poly-silicon, by way of example, is then deposited, patterned and released. The poly-silicon layer is etched by a reactive ion etch to expose the sacrificial silicon dioxide layer. The sacrificial layer is then etched, usually with an acid (hydrofluoric acid), to release the MEM component. However, MEM components created from poly-silicon have limited mechanical strength and exhibit relatively poor electrical isolation. Further, production yields are poor using this method since the wet hydrofluoric etch often results in the MEM component sticking to the substrate rather than being suspended.

If a high electrical isolation is required, fabrication of MEM components on a glass substrate generally required either ionic (application of high voltage) or fusion (high temperature) bonding techniques to create MEM components. Both of these bonding techniques are poorly suited for use when semiconductor devices are present on the same substrate. Specifically, with ionic bonding the high voltage may damage sensitive electrical components while the high processing temperature associated with both ionic and fusion bonding may cause junctions depths to change affecting device performance and reliability. It is also known that such bonding techniques require very smooth surface to surface contact to ensure a good bond. If the surfaces do not mate within acceptable tolerances, the reaction or inter-diffusion process will result in a defective bond. Further, these bonding techniques are sensitive to surface contamination or irregularities which may result in bond failure sites or a decrease in production yields.

In another prior art method, a glass substrate is bonded to a silicon dioxide layer using ionic or fusion bonding techniques. Prior to bonding, the silicon dioxide layer is deposited on top of a silicon wafer so that the bonding process forms a glass-silicon dioxide-silicon composite structure. The silicon is patterned and wet etched to define the MEM component.

As mentioned above, ionic or fusion bonding require a high process temperature which are in the range of about 450° C. to 500° C. Further, the glass substrate must be conductive to facilitate bonding with the silicon dioxide. Such conductivity precludes achieving high electrical isolation in the final MEM system. Further still, with the wet etch used to release the MEM component, the structure often sticks to the substrate rather than remaining free standing.

The present invention provides a method that uses adhesive bonding to form a MEM component on top of a glass substrate so that the MEM component is electrically isolated from the substrates. Further, the present process uses a dry etch to release the MEM component. Thus, whatever the merits of the above described prior art methods, they do not achieve the benefits of the present invention.

SUMMARY OF THE INVENTION

The present invention relates to a fabrication process for manufacture of micro electromechanical (MEM) systems having components, such as cantilever supported beams, spaced above the substrate. This fabrication process uses as few as two lithographic masking steps depending on the complexity of the device and provides MEM components that are electrically isolated from the substrate.

Specifically, in one embodiment of the present invention, a composite silicon-film-glass substrate structure is formed. The silicon layer is processed by either polishing, grinding or etching to obtain the desired thickness, patterned to define the MEM component and etched to expose the film layer. The film layer is a sacrificial layer that is then patterned and dry etched to release the MEM component.

In other embodiment of the present invention, the process comprises the steps of growing a layer of doped silicon on a silicon wafer or substrate and depositing a layer of insulating material such as silicon dioxide on the doped silicon. This embodiment includes the use of a silicon on insulator (SOI) substrate. The silicon substrate is adhesive bonded to a glass substrate to create a composite silicon-silicon dioxide-silicon-adhesive-glass structure. The silicon is patterned and etched using anisotropic plasma dry etching techniques. A second patterning then follows to pattern the silicon dioxide layer and an oxygen plasma etch is performed to undercut the adhesive film and to release the doped silicon MEM component. This two-mask process provides single crystal silicon MEM component that is electrically isolated from the glass substrate but mechanically joined thereto.

The adhesive serves a dual role as a bonding agent and as a sacrificial layer that can be readily removed to release the MEM component in an effective and efficient manner. Specifically, the dry oxygen plasma etch undercuts the adhesive without causing the MEM component to stick to adjacent surfaces—a common problem with wet chemical releases. In addition the oxygen plasma is a benign process with respect to the other material of the composite structure.

In accordance with the present invention, fabrication of very small cantilever supported beams, switches or other micro electromechanical structures are readily incorporated with other circuit functions on an integrated circuit device.

The present invention is particularly well suited for manufacture of long narrow freestanding beams parallel to the substrate that can move in response to pressure, electromagnetic, mechanical or other such stimuli.

Also, the surfaces of the substrates need not be perfectly smooth since the adhesive layer eliminates the need to use fusion or ionic bonding techniques to form the composite structure. Indeed, preexisting diffusions or surface irregularities may be present in the substrates with little or no impact on yield or the integrity of the composite structure. This provides very flexible design options since electrical components may be positioned in close proximity to the MEM component.

These and other advantages of the present invention not specifically described above will become clear within the detailed discussion herein.

DETAILED DESCRIPTION OF THE INVENTION

In the following description of the preferred embodiment, reference is made to the accompanying drawings, which form a part hereof, and in which is shown by way of illustration a specific embodiment in which the invention may be practiced. In the following description, numerous specific details are set forth in order to provide a through understanding of the present invention. It will be apparent, however, to one skilled in the art that the present invention may be practiced without these specific details. In other instances, well-known structures and techniques are not shown or discussed in detail in order not to unnecessarily obscure the present invention. Reference will now be made in detail to the preferred embodiments of the invention, examples of which are illustrated in the accompanying drawings.

Figure 1:
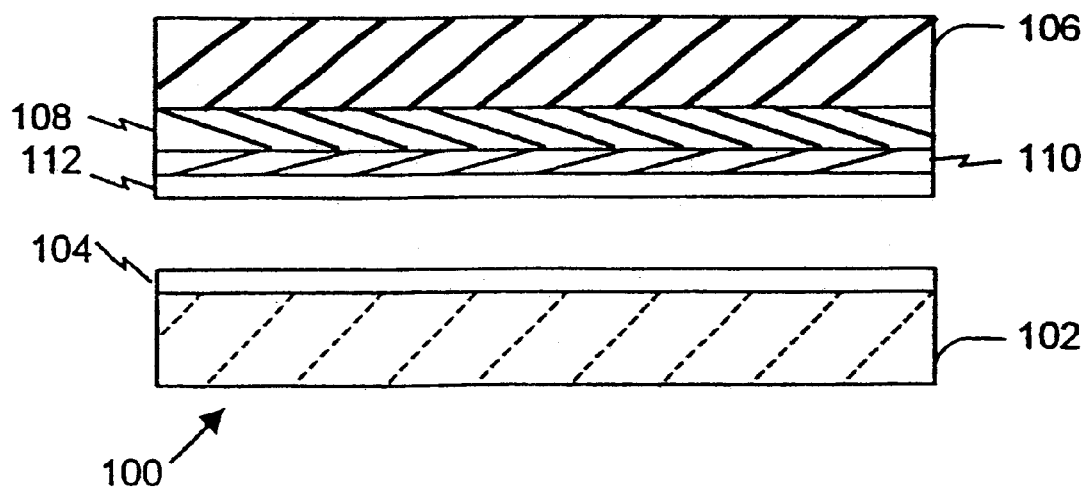
FIG. 1 is a sectioned view of the first and second substrates which, when combined, will form a composite structure in accordance with the present invention.

Referring now to FIG. 1, process 100 comprises a plurality of steps performed on two principal wafer-like elements: a glass substrate 102 shown with an organic adhesive layer 104 applied to one surface and a sacrificial semiconductor substrate 106. The two substrates are each individually processed, combined to form a composite structure and then further processed to define a micro electromechanical (MEM) component.

MEM components are miniaturized freestanding structures spaced above but physically connected to substrate 102 and electrically coupled to other circuit elements on substrate 102. Examples of typical MEM components may include cantilever supported switches, diaphragms for pressure sensing applications or suspended beams supported at each end but otherwise physically spaced from the substrate.

Substrate 102 preferably comprises an electrically insulating glass material such quartz, sodium silicate $Na_2O$—$SiO_2$ or borosilicate $B_2O_3$—$SiO_2$. One preferred substrate uses a high silica glass substrate marketed under the tradename of Vycor, available from Corning Incorporated of Coming, N.Y. Alternatively, in applications where it is desired to utilize substrate 102 as a conducting element, a semiconductor material may be used. An organic adhesive layer 104 is spun onto substrate 102. Spin coating would provide the most practical method for application of the organic adhesive. However, other coating methods such as spray coating, or staged partially-cured thin films, which are applied to the wafer, by way of example, may be used to deposit organic adhesive layer with substantially uniform thickness.

Carrier substrate 106 is either a p-type or n-type silicon wafer such as is commonly used in semiconductor processing; the orientation and conductivity of the wafer will, of course, depend on the specific application. Using known semiconductor processing techniques, a silicon layer 108 is grown on carrier substrate 106. Layer 108 may be doped with boron, germanium or other known dopants to impart an etch stop and semiconductor properties. Using semiconductor device manufacturing techniques, electrical components such as resistors, capacitors, inductors or interconnects may be readily formed. An optional silicon dioxide layer 110 is grown on top of silicon layer 108 and an organic adhesive layer 112 is spun on top. The silicon dioxide layer may be eliminated if the rigidity of the MEM component is not critical. Further, either adhesive layer 104 or 112 may omitted from the process since only one layer may be necessary in some applications.

The term organic adhesive refers to thermal setting plastics in which a chemical reaction occurs. The chemical reaction increases cross-linking of the polymer to increase rigidity as well as creating a chemical bond with the surfaces being mated.

While epoxy is the most versatile type of organic adhesive for the present invention, other potential adhesives include polyimide, silicones, acrylics, polyurethanes, polybenzimidazoles and polyquinoralines. Other types of organic adhesives such as thermal plastics, which require heating above their melting point like wax, would not be of value for this application. The selection of the adhesive would depend in large part on the polymer's thermal characteristics and particularly its glass transition temperature. Other selection criteria include economics, adhesive strength on different substrates, cure shrinkage, environmental compatibility and coefficient of thermal expansion.

The glass transition temperature is the temperature at which chemical bonds can freely rotate around the central polymer chain. As a result, below the glass transition temperature, the polymer, when cured, is a rigid glass-like material. Above the glass transition, however, the polymer is a softer elastomeric material. Further at the glass transition temperature, there is a substantial increase in the coefficient of thermal expansion (CTE). Accordingly, when the glass transition temperature is exceeded, there is an increase in the CTE and there is a relief of stress in the polymer layer.

Substrates 102 and 106 may be treated to improve the adhesion of the epoxy. Common treatments include plasma or surface etch treatments. The use of a coupling agent or adhesion promoter such as 3-glycidoxy-propyl-trimethoxy-silane (available from Dow Corning as Z-6040) or other agents having long hydrocarbon chains to which the epoxy may adhere may be used to improve coating consistency. Wetting agents may be used to improve coating uniformity. However, in most cases, the coupling agent may serve dual purposes of surface wetting and surface modification. With the use of organic material, surface finish is not overly critical and the surface need not be smooth. Surface structures such as resistors, inductors, capacitors, transistors or conductors may advantageously be added to the surface areas of substrates 102 and 106.

Substrates 102 and 106 are then positioned in a vacuum chamber (not shown) with opposing adhesive layers 104 and 112. The chamber is evacuated to remove air that could be trapped between the substrates during the mating process. Once a vacuum is achieved, the substrates are aligned and physically joined together to form a composite structure with a single bead of epoxy. Advantageously, backside alignment marks may be optically referenced to facilitate the alignment.

Figure 2:
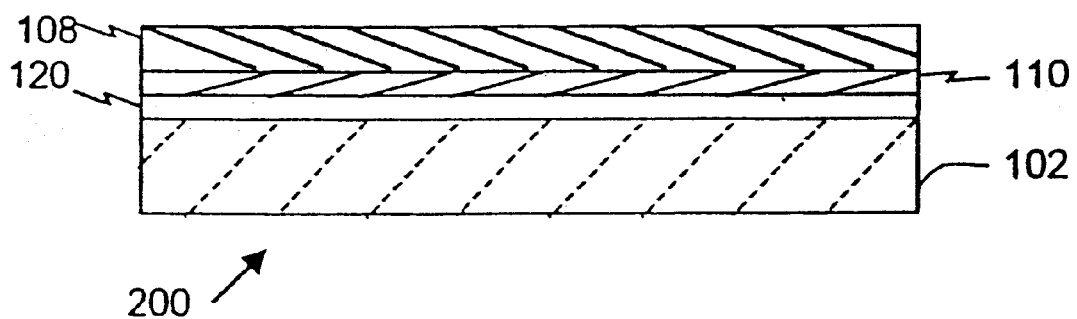
FIG. 2 is a sectioned view of the substrates, shown in FIG. 1, adhesively bonded to form one embodiment of a composite structure.

Composite structure 200 is shown more clearly in FIG. 2. The organic adhesive layers 104 and 112 combine to form a single adhesive layer 202 to bond the composite structure. The adhesive is cured by baking composite structure 200 for a sequence of oven bakes at elevated temperatures of up to 180° C. to reduce cure shrinkage. The recommended cure temperatures depend on the type of epoxy used. Preferably, once cured, the epoxy is able to withstand elevated temperatures typically associated with many semiconductor processing steps (that is, a temperature up to 250° C.) without additional shrinkage or substantial degradation.

Further, the adhesive should have a limited amount of cure shrinkage so as to minimize the possibility of inducing cracking or stress fractures in composite structure 200. The phrase "cure shrinkage" refers to a change in volume of a thermosetting adhesive during the cure cycle due to the reaction, generally an out-gassing product or rearrangement of the polymer itself. Cure shrinkage can cause considerable pressure to develop along the length of the bond during processing.

An additional component closely associated with cure shrinkage is the adhesive's CTE at the cure temperature and at the operating temperature. Generally, organic adhesives will have a higher CTE than any other material present in the MEM component. This means that the adhesive will expand at a higher rate than will other material as the ambient temperature increases. Although an inorganic filler material may be added to the adhesive to reduce the CTE such fillers are not recommended in this application since such inorganic filler material cannot be etched using oxygen plasma during the structural releasing step.

Substrate 102 may also be selected for a desired CTE. The substrate in one preferred embodiment has a CTE that is substantially similar to but less than that of silicon so that the resulting MEM component will be slightly stretched (or in tension). In this manner, smaller structures will retain some degree of elasticity and will be less susceptible to developing a bow or collapsing upon release of the MEM component. It will be appreciated that if the CTE of substrate 102 is greater than that of silicon, the MEM component will be in compression upon release. Larger beams may be capable of retaining the structural integrity in compression after all process steps are complete. Use of glass substrate 102 was selected in the described embodiment primarily to achieve high electrical isolation. However, one skilled in the art will appreciate that the process steps of the present invention may be applied to selected substrates other than the above described glass substrate due the versatility of the bonding and sacrificial layer.

Due to the number of material types present in the composite structure 200, thermal processing and the mismatching of thermal coefficients may impart shear fractures or stress cracks in one or both substrates or in the various layers. The CTE in the bond line of the MEM component will depend upon the polymer used, its curing agent, and the thermal cycle used to cure the polymer. When the processing and operating temperatures are maintained so that the polymer is not exposed to temperatures exceeding the glass transition temperature, the polymer is a rigid glass-like material and the CTE is minimized. If the glass transition temperature is exceeded, however, there will be an increase in the CTE, which may result in a relief of stress in the polymer layer. Any such stress relief after composite structure 200 is formed may deform composite structure 200. Since flexible or elastomeric polymers will have a high CTE, a thin bond line is desirable to minimize structural damage in the event the glass transition temperature is inadvertently exceeded. In one preferred embodiment, the bond line has a thickness of about five (5) to seven (7) microns.

Referring again to FIG. 1, the next step is to remove substrate 106 and expose silicon layer 108. Substrate 106 is removed using a backside chemical etch. A mechanical grinding or polishing step may proceed the chemical etch to reduce the amount of silicon etching required or to reduce the selectivity needed in the etch stop. Since substrate 106 primarily functions as a sacrificial carrier for silicon layer 108, there is no need to preserve substrate 106 in the region of the MEM component so as to facilitate subsequent processing of silicon layer 108. Alternatively, if a specific application required thick or rigid beams, one skilled in the art will appreciate that substrate 106 could be patterned and selectively etched for use as beam material or retained in adjacent areas as a substrate for integrated circuit devices.

Figure 3:
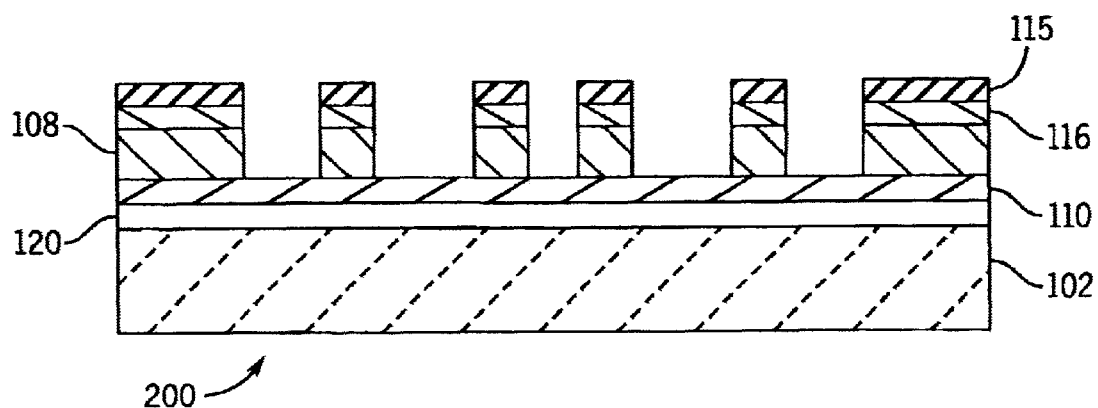
FIG. 3 is a sectioned view of the composite structure of FIG. 2 illustrating a partial etching to define a micro electromechanical (MEM) component in accordance with the present invention.

As shown in FIG. 3, an optional layer of aluminum 116 is deposited onto the exposed surface of silicon layer 108. Aluminum 116 is patterned with a first mask to form conducting areas and to expose selected portions of silicon layer 108. The aluminum is either lifted off of etched using an aluminum-specific chemical agent. An oxide or nitride cap 115 may be applied on top of the aluminum layer 116 to form a protective barrier.

With silicon layer 108 exposed through the aluminum 116, an anisotropic etch defines the structural dimensions of the MEM component. This etch stops upon reaching the silicon dioxide layer 110.

Figure 5:
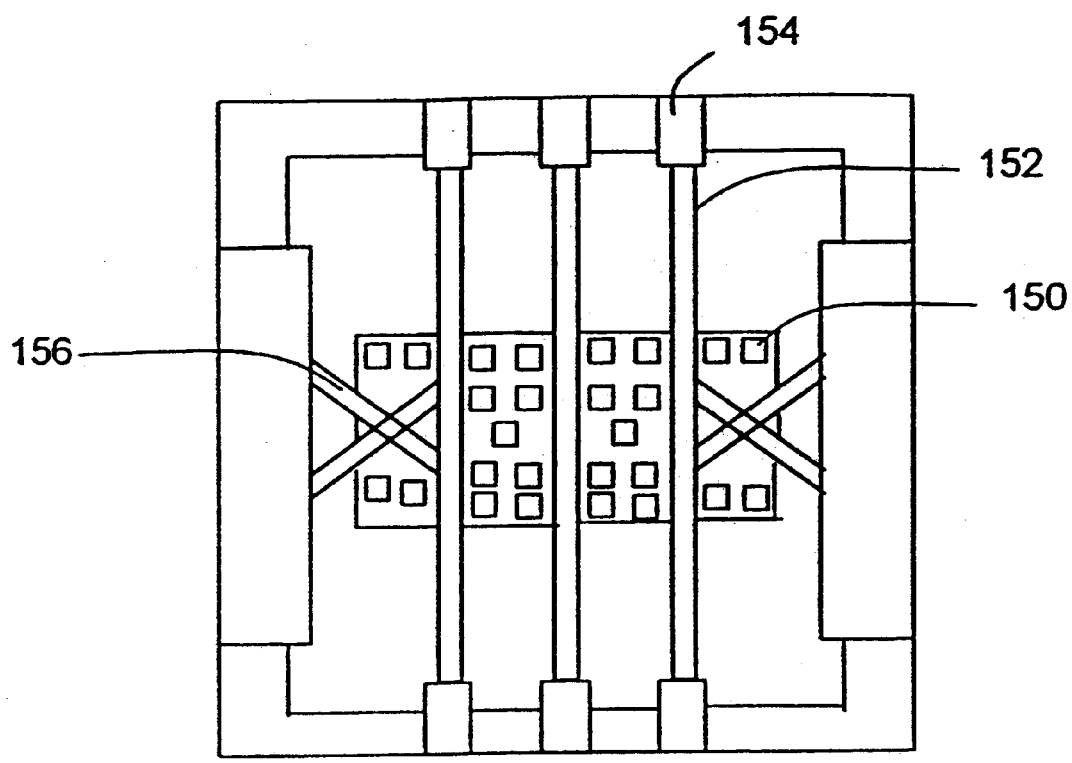
FIG. 5 illustrates, in a general manner, a MEM component manufactured on a glass substrate in accordance with the present invention.

A second mask is applied to pattern the insulating silicon dioxide layer 110 and then etched. It is important to note that due to its insulating properties, portions of silicon dioxide layer 110 may be retained to mechanically support selective areas of the MEM component while maintaining electrical isolation. Specifically as shown in FIG. 5, holes 150 may be etched into silicon dioxide layer 110 to facilitate etching adhesive layer 120.

Figure 4:
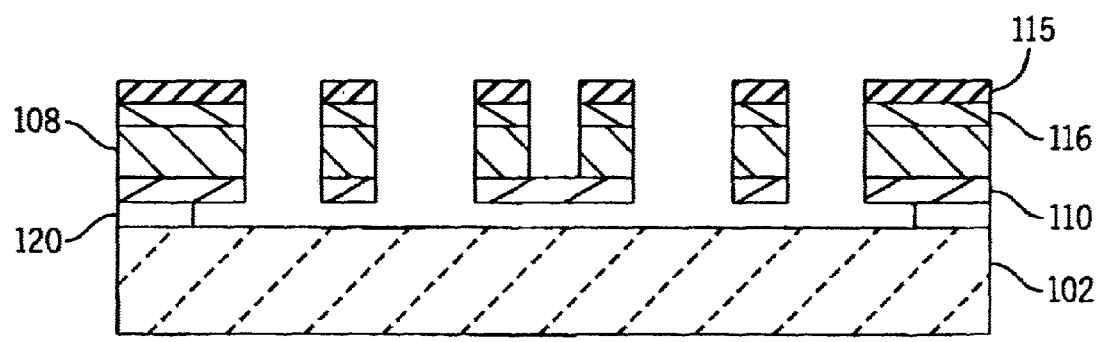
FIG. 4 is a sectioned view of the composite structure of FIG. 2 illustrating the release of the MEM component in accordance with the present invention.

Referring now to FIG. 4, adhesive layer 120 is etched in a final process step to release the MEM component. In the preferred embodiment, dry oxygen ($O_2$) plasma etch undercuts adhesive layer 120. Since this plasma etch is a dry release, manufacturing yields are improved relative to wet etching. Specifically, as one familiar with semiconductor technology will appreciate, wet etching may lower production yields as water molecules get trapped under the released MEM components causing the MEM component to stick to substrate 102.

Upon MEM component release, stress forces along the bond line will be substantially released. Further, any pressure generated by shrinkage of the organic adhesive during cure will be significantly reduced after processing by dicing the wafers into discrete devices resulting in mechanically stable devices.

Figure 6:
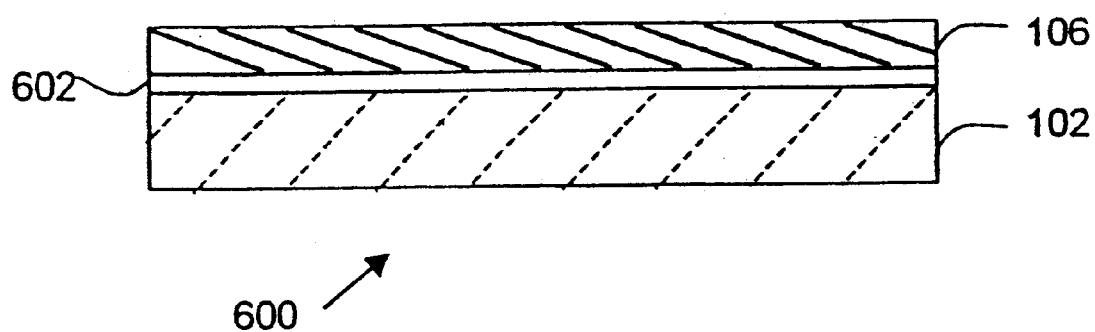
FIG. 6 is a sectioned view of another embodiment of a composite structure formed in accordance with the present invention.

Another embodiment of a composite structure formed in accordance with the present invention is shown in FIG. 6. Structure 600 comprises a first and second substrate 106 and 102. Specifically, substrate 102 is preferably a glass substrate that exhibits high electrical isolation while substrate 106 is a semiconductor substrate. Substrate 106 may be either p or n-type and may be selectively doped to impart conductive or semiconductor properties. Substrates 102 and 106 are joined together by an adhesive film 602.

If preferred, substrate 106 may be ground and polished to a desired thickness, patterned to define a MEM component and etched to expose the adhesive film 602. The film is then patterned and dry etched to release the MEM component. As will be understood, substrates 102 and 106 may further include conductive elements such as switch contacts or electrodes (not shown).

Figure 7:
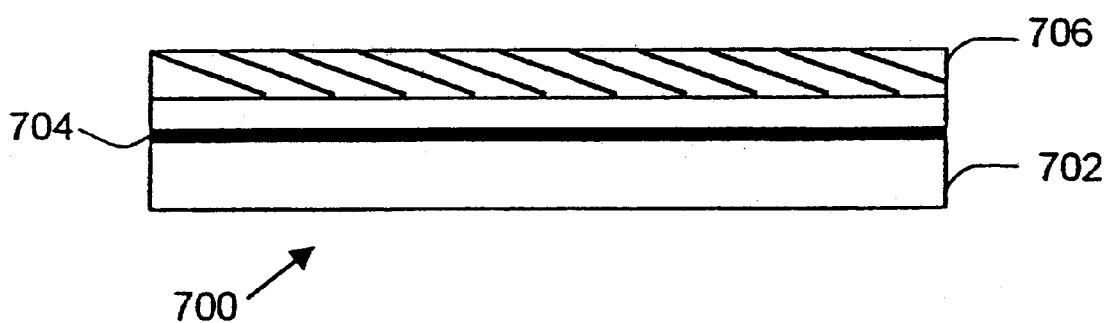
FIG. 7 shows another alternative embodiment of a composite structure 700 from which a MEM component may be readily obtained.

FIG. 7 shows another alternative embodiment of a composite structure 700 from which a MEM component may be readily obtained. Silicon on insulator (SOI) substrate 702 has a buried layer of silicon dioxide layer 704 that acts as an etch stop. The buried silicon dioxide layer can be formed by several commercially available techniques, including implanting oxygen ($O_2$), deep into substrate 702. The silicon-oxide-silicon (which may be either doped to impart semiconductor properties or undoped) is adhesively bonded to substrate 706 to form a composite structure. In the preferred embodiment, substrate 706 is a glass substrate. Using the techniques described above, the MEM component is defined and released by the two-mask patterning and etching process.

Referring again to FIG. 5, a topological view of an integrated circuit comprising a MEM component is shown. This circuit is an exemplary view of one type of MEM component that may be created using the process of the present invention. Beams 152 of about one micrometer wide and several millimeters in length are constructed using the above-described process. The thickness of these beams may range from about 20–30 micrometers up to about 100 micrometer. One skilled in the art will appreciate that the above-described dimensions may be readily changed depending on the specific application. Support beams 154 may add rigidity to selected ones of beams 152.

With the present invention a very high aspect ratio may be achieved for the MEM component. By way of example, very narrow, deep MEM sensors are obtained using the above described process steps. Thus this type of sensor will have high capacitance value that is easy to detect. Advantageously, sensor interface may be achieved by electrically bonding to pads 156.

The process of the present invention is independent of the substrate material. Since epoxy or organic adhesives, in general, readily bond a wide variety of substrates, substrates may be selected depending on the specific application in which the MEM component will interface. The low temperature bonding readily enables the use of gallium arsenide, silicon or other material on a glass substrate. Further, the process is readily applied to applications where silicon or gallium arsenide substrates are desired instead of a glass substrate.

It will be appreciated that it is also very desirable in many applications to position electronic circuits in close proximity to the MEM component. With the present invention, transistors or other circuit elements may be fabricated directly on the silicon, prior to creating the composite structure of FIG. 2. Further, with the present invention, structures can be formed on both sides of the beam. By way of example, aluminum can be deposited between the silicon dioxide and the silicon layers (see FIG. 1) to create a very conductive structure. One skilled in the art will appreciate that the low process temperatures employed to create the composite structure, to define or to release the MEM components has minimal impact on junction depths or circuit device parameters.

While certain exemplary preferred embodiments have been described and shown in the accompanying drawings, it is to be understood that such embodiments are merely illustrative of and not restrictive on the broad invention. Further, it is to be understood that this invention shall not be limited to the specific construction and arrangements shown and described since various modifications or changes may occur to those of ordinary skill in the art without departing from the spirit and scope of the invention as claimed.

We claim:

1. A microelectromechanical (MEM) device comprising:
    a) a first substrate defining an upper surface that extends along a plane defined by a lateral direction and a longitudinal direction;
    b) a second substrate including:
        i. first and second longitudinal outer members disposed at opposing longitudinal outer ends of the second substrate and permanently connected to the upper surface of the first substrate; and
        ii. a central member connected between the first and second longitudinal outer members, wherein the central member has first and second lateral edges that define a thickness of the central member, the central member defining a void disposed between at least a portion of the central member and the upper surface of the first substrate, wherein the void is continuous between the first and second lateral outer edges of the central member.

2. The MEM device as recited in claim 1, wherein the portion of the central member is suspended above the first substrate.

3. The MEM device as recited in claim 1, wherein the central member is integrally connected to the first and second longitudinal outer members.

4. The MEM device as recited in claim 1, wherein the second substrate is elongated along a direction defined by the longitudinal axis.

5. The MEM device as recited in claim 1, wherein the longitudinal outer members are connected to the first substrate via an adhesive.

6. The MEM device as recited in claim 1, further comprising a conductive layer disposed on top of the central member.

7. The MEM device as recited in claim 6, wherein the conductive layer comprises aluminum.

8. The MEM device as recited in claim 6, further comprising a protective barrier disposed on top of the conductive member.

9. The MEM device as recited in claim 8, wherein the protective barrier is selected from the group: consisting of an oxide and a nitride.

10. The MEM device as recited in claim 1, wherein the first substrate is insulating.

11. The MEM device as recited in claim 1, wherein the second substrate further comprises a layer of silicon having an insulating layer formed thereon.

12. The MEM device as recited in claim 11, wherein the insulating layer comprises silicon dioxide.

13. The MEM device as recited in claim 11, wherein the central member is formed by attaching the second substrate to the first substrate via an adhesive, and removing at lease a portion of the adhesive.

14. The MEM device as recited in claim 1, wherein the second substrate comprises an SOI wafer.

15. The MEM device as recited in claim 1, wherein the thickness of the central member is substantially one micrometer.

16. The MEM device as recited in claim 1, wherein the thickness of the central member is between 20 micrometers and 100 micrometers.

17. The MEM device as recited in claim 1, wherein the central member has a length greater than 1 millimeter.

* * * * *